United States Patent
Greenberg et al.

(10) Patent No.: US 6,787,427 B2
(45) Date of Patent: Sep. 7, 2004

(54) METHOD TO FABRICATE SIGE HBTS WITH CONTROLLED CURRENT GAIN AND IMPROVED BREAKDOWN VOLTAGE CHARACTERISTICS

(75) Inventors: David R. Greenberg, White Plains, NY (US); Basanth Jagannathan, Beacon, NY (US); Shwu-Jen Jeng, Wappingers Falls, NY (US); Joseph T. Kocis, Pleasant Valley, NY (US); Samuel C. Ramac, Poughkeepsie, NY (US); David M. Rockwell, Susquehanna, PA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/676,171

(22) Filed: Oct. 1, 2003

(65) Prior Publication Data

US 2004/0063293 A1 Apr. 1, 2004

Related U.S. Application Data

(62) Division of application No. 10/047,975, filed on Jan. 15, 2002, now Pat. No. 6,656,809.

(51) Int. Cl.⁷ ............................................. H01L 21/331
(52) U.S. Cl. ...................................... 438/309; 438/342
(58) Field of Search ................................. 438/309, 342

(56) References Cited

U.S. PATENT DOCUMENTS

| | | | |
|---|---|---|---|
| 5,250,448 | A | 10/1993 | Hamasaki et al. |
| 5,365,090 | A | 11/1994 | Taka et al. |
| 5,471,085 | A | 11/1995 | Ishigaki et al. |
| 5,525,825 | A | 6/1996 | Nagel |
| 5,691,546 | A | 11/1997 | Morishita |
| 5,773,350 | A | 6/1998 | Herbert et al. |
| 5,821,149 | A | 10/1998 | Schuppen et al. |

FOREIGN PATENT DOCUMENTS

| | | |
|---|---|---|
| JP | 3-240239 | 10/1991 |
| JP | 3240239 | 10/1991 |
| JP | 6224459 | 8/1994 |
| JP | 2000124225 | 4/2000 |
| JP | 52000277763 | 10/2000 |

Primary Examiner—John F. Niebling
Assistant Examiner—Christopher Lattin
(74) Attorney, Agent, or Firm—Scully, Scott, Murphy & Presser; Joseph P. Abate, Esq.

(57) ABSTRACT

A method of fabricating a SiGe heterojunction bipolar transistor (HBT) is provided which results in a SiGe HBT that has a controllable current gain and improved breakdown voltage. The SiGe HBT having these characteristics is fabricated by forming an in-situ P-doped emitter layer atop a patterned SiGe base structure. The in-situ P-doped emitter layer is a bilayer of in-situ P-doped a:Si and in-situ P-doped polysilicon. The SiGe HBT structure including the above mentioned bilayer emitter is also described herein.

11 Claims, 2 Drawing Sheets

METHOD TO FABRICATE SIGE HBTS WITH CONTROLLED CURRENT GAIN AND IMPROVED BREAKDOWN VOLTAGE CHARACTERISTICS

RELATED APPLICATION

This application is a divisional of U.S. application Ser. No. 10/047,975, filed Jan. 15, 2002 now U.S. Pat. No. 6,656,809.

FIELD OF THE INVENTION

The present invention relates to heterojunction bipolar transistors (HBTs), and more particularly to a method of fabricating SiGe HBTs which exhibit controlled current gain and improved breakdown voltage. The present invention is also directed to a SiGe HBT structure which includes a bilayer of in-situ phosphorus (P)-doped amorphous silicon (a:Si) and in-situ P-doped polysilicon as the emitter.

BACKGROUND OF THE INVENTION

Significant growth in both high-frequency wired and wireless markets has introduced new opportunities where compound semiconductors such as SiGe have unique advantages over bulk complementary metal oxide semiconductor (CMOS) technology. With the rapid advancement of epitaxial layer pseudomorphic SiGe deposition processes, epitaxial-base SiGe heterojunction bipolar transistors have been integrated with mainstream advanced CMOS development for wide market acceptance, providing the advantages of SiGe technology for analog RF (radio frequency) circuitry while maintaining the utilization of the advanced CMOS technology base for digital logic circuitry.

In a conventional emitter polysilicon process, the current gain beta, Ic/Ib, is controlled by depositing a thin interfacial oxide layer prior to deposition of the polysilicon emitter. This thin oxide layer is employed as a minority carrier barrier to reduce base current (Ib) and to increase current gain. As this interfacial oxide layer becomes very thin, the thickness uniformity of the oxide becomes an issue. Specifically, as the interfacial oxide becomes thin, the oxide layer has a non-uniform thickness which causes beta variation. In view of the above drawbacks with prior art emitter polysilicon processes, there is a continued need for providing a process of fabricating SiGe HBT which is capable of controlling the current gain without the worry of oxide thickness non-uniformity issues.

SUMMARY OF THE INVENTION

One object of the present invention is to provide a method of fabricating a SiGe HBT which has a controllable current gain associated therewith.

A further object of the present invention is to provide a method of fabricating a SiGe HBT which has improved breakdown voltage characteristics associated therewith.

A yet further object of the present invention is to provide a method of fabricating a SiGe HBT which has a low beta, i.e., collector current Ic/base current Ib, associated therewith.

These and other objects and advantages are achieved in the present invention by utilizing a method wherein the emitter is formed by an in-situ P-doped deposition processing step.

Specifically, the method of the present invention comprises:

forming an emitter layer atop a patterned SiGe base structure, wherein said emitter layer is a bilayer of in-situ P-doped a:Si and in-situ P-doped polysilicon.

In some embodiments of the present invention, an oxide layer is formed atop exposed portions of the single crystal SiGe base region of the patterned SiGe base structure prior to forming the emitter layer. In yet other embodiments of the present invention, the in-situ P-doped a:Si layer is annealed after its formation.

Another aspect of the present invention relates to a SiGe HBT structure which comprises a patterned SiGe base structure which includes at least a SiGe layer present atop a substrate and a patterned insulator present atop the SiGe layer having an opening that exposes a portion of said SiGe layer; and an emitter layer formed atop said SiGe base structure including in said opening, said emitter layer is a bilayer of in-situ P-doped a:Si and in-situ P-doped polysilicon.

DETAILED DESCRIPTION OF THE INVENTION

Figure 1:
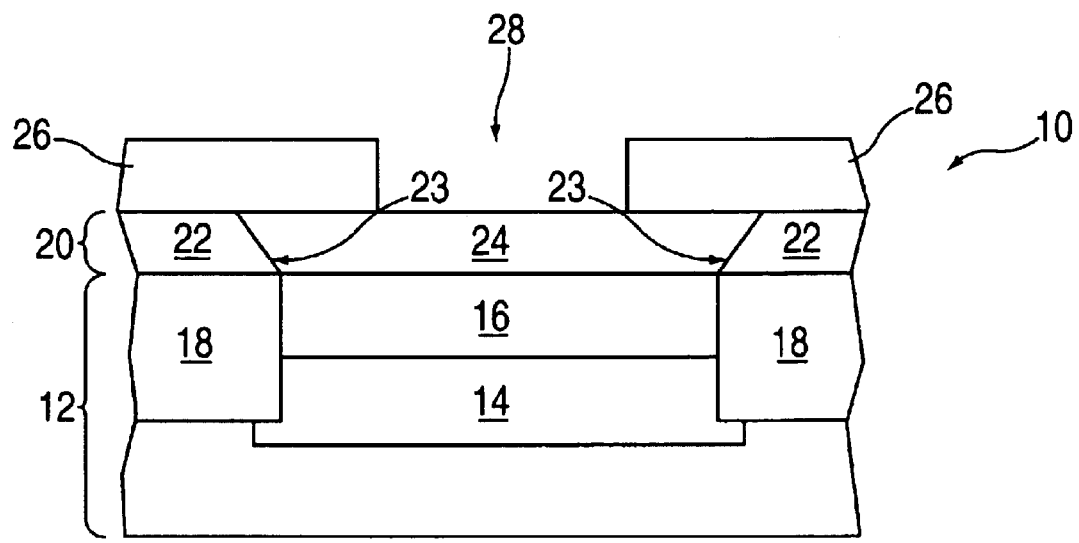
FIGS. 1–4 are pictorial representations (through cross-sectional views) illustrating the various processing steps of the present invention.

The present invention, which provides a method of fabricating a SiGe HBT and the SiGe HBT structure itself that exhibits a controlled current gain and improved breakdown voltage, will now be described in greater detail by referring to the drawings that accompany the present application. For simplicity, a single bipolar device region is shown in the drawings. Other bipolar device regions as well as digital logic circuitry may be formed adjacent to the bipolar device region depicted in the drawings.

Reference is first made to FIG. 1 which illustrates an initial structure that is employed in the present invention. Specifically, the initial structure shown in FIG. 1 is a patterned SiGe base structure (labeled as 10) which includes semiconductor substrate 12 of a first conductivity type (N or P) having sub-collector region 14 and collector region 16 formed therein. The substrate further includes isolation regions 18 which define the outer boundaries of the bipolar device region and which serve to isolate the bipolar device region shown in the drawings from adjacent device regions.

The patterned SiGe base structure of FIG. 1 also includes SiGe layer 20 formed atop the surface of semiconductor substrate 12. In accordance with the present invention, SiGe layer 20 includes polycrystalline SiGe regions 22 that are formed predominately over isolation regions 18 and single crystal SiGe base region 24 which is formed predominately over the collector and subcollector regions. The SiGe base region includes extrinsic base and intrinsic base regions. These regions are not expressly labeled in the drawings, but are nevertheless meant to be included within SiGe base region 24. It is noted that the extrinsic and intrinsic base regions of the initial structure are sometimes referred to as the pedestal portion of a bipolar transistor device. The patterned SiGe base structure of FIG. 1 also comprises patterned insulator 26 which has opening 28 formed therein which exposes a portion of SiGe base region 24.

The initial patterned SiGe base structure shown in FIG. 1 is composed of materials that are well known in the art and the initial structure is fabricated using conventional processing steps that are also well known to those skilled in the art.

For example, semiconductor substrate 12 is composed of a semiconductor material including, but not limited to: Si, Ge, and SiGe. Layered substrates comprising the same or different semiconducting materials, e.g., Si/Si or Si/SiGe, are also contemplated herein. Of these semiconducting materials, it is preferred that substrate 12 be composed of Si. As mentioned above, substrate 12 may be a N-type substrate or a P-type substrate depending on the type of device to be subsequently formed.

The structure of FIG. 1 is fabricated by first forming an oxide layer (not shown) on the surface of substrate 12 using a conventional deposition process such as chemical vapor deposition (CVD), plasma-assisted CVD, or sputtering. Alternatively, the oxide layer is grown using a conventional thermal oxidation process. Sub-collector 14 is then formed in the substrate using a conventional ion implantation process. After the implantation process, a thick oxide (also not shown) is grown on the surface to eliminate implant damage. Next, the thick oxide and the previously formed oxide layer are removed utilizing an etching process which has a high selectivity for removing oxide as compared to substrate.

Isolation regions 18 are then formed by either using a conventional local oxidation of silicon (LOCOS) process or by utilizing lithography, etching and trench isolation filling. It is noted that the drawings show the formation of trench isolation regions which are formed as follows: A patterned masking layer (not shown) is first formed on the surface of substrate 12 exposing portions of the substrate. Isolation trenches are then etched into the exposed portions of the substrate utilizing a conventional dry etching process such as reactive-ion etching (RIE) or plasma-etching. The trenches thus formed may be optionally lined with a conventional liner material, i.e., an oxide, and thereafter CVD or another like deposition process is employed to fill the trenches with $SiO_2$ or another like trench dielectric material. The trench dielectric material may optionally be densified after deposition and a conventional planarization process such as chemical-mechanical polishing (CMP) may also be optionally performed.

Following the formation of isolation regions in the substrate, collector region 16 is formed in the bipolar device region utilizing conventional ion implantation and activation annealing processes well known to those skilled in the art. The activation annealing is typically carried out at a temperature of about 950° C. or above for a time period of about 30 seconds or less.

At this point of the inventive process, the bipolar device region shown in the drawings may be protected by forming a protective material such as $Si_3N_4$ thereon and conventional processing steps which are capable of forming adjacent device regions can be performed. After completion of the adjacent device regions and subsequent protection thereof, the inventive process continues. It should be noted that in some embodiments of the present invention, the adjacent device regions are formed after completely fabricating the bipolar transistor.

The next step in fabricating the structure shown in FIG. 1 is to form SiGe layer 20 atop substrate 12 (over the collector and subcollector regions) as well as isolation regions 18. In accordance with the present invention, the SiGe layer includes polycrystalline SiGe regions 22 that are formed predominately over isolation regions 18, and single crystal SiGe base region 24 which is formed predominately over the collector and subcollector regions. Reference numeral 23 denotes the interface, or facet region, between the single crystal and polycrystalline SiGe regions. The SiGe layer is lightly doped (on the order of about 1E19 $cm^{-2}$ or less) with boron.

The SiGe layer is formed epitaxially utilizing any conventional deposition technique including, but not limited to: ultra-high vacuum chemical vapor deposition (UHVCVD), molecular beam epitaxy (MBE), rapid thermal chemical vapor deposition (RTCVD) and plasma-enhanced chemical vapor deposition (PECVD). The conditions used in forming the SiGe layer (which are conventional and well known to those skilled in the art) may vary depending upon the desired technique employed.

An insulator (which will subsequently become patterned insulator 26) is then formed atop the SiGe layer utilizing a conventional deposition process such as CVD, plasma-assisted CVD, chemical solution deposition and other like deposition processes. The insulator may be a single layer, as shown in the drawings, or it may contain multi-insulator layers. The insulator layer is composed of the same or different insulating material which may include, for example, $SiO_2$ or Si oxynitrides.

Opening 28 is then formed in the insulator so as to expose a portion of the SiGe base region. The opening is formed utilizing conventional lithography (including applying a photoresist to the insulator, patterning the photoresist by exposing the same to a pattern of radiation and developing the pattern into the photoresist using a conventional developer) and etching. The etching is selective in removing the insulator as compared to the SiGe base region. After etching, the photoresist is removed utilizing a conventional stripping process so as to provide the patterned SiGe base structure including patterned insulator 26 shown in FIG. 1.

Figure 2:
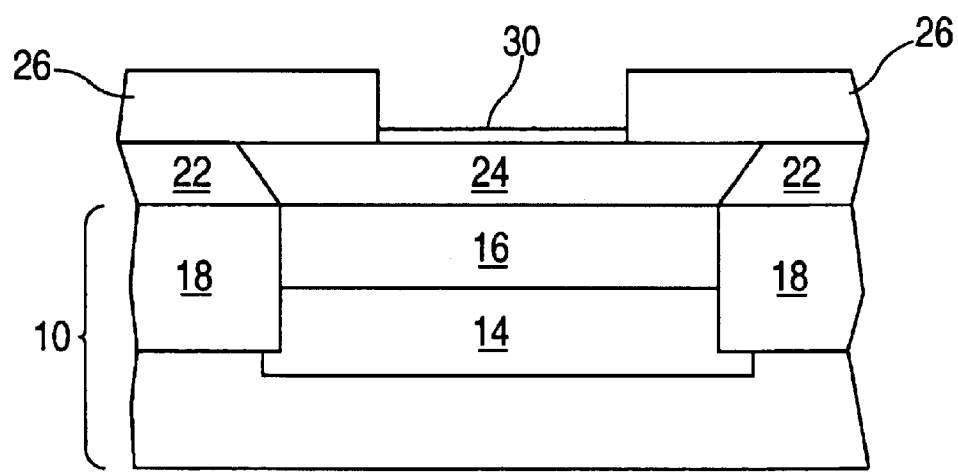

In some embodiments of the present invention, optional oxide layer 30 is formed on the exposed SiGe base region that is not protected by the patterned insulator so as to provide the structure shown in FIG. 2. The optional oxide layer is a thin oxide layer having a thickness of from about 0.2 to about 2.0 nm, with a thickness of from about 0.5 to about 1.0 nm being more highly preferred. Optional oxide layer 30 is formed utilizing a rapid thermal oxidation (RTO) process wherein the oxide layer is grown in an oxygen-containing atmosphere at a temperature of about 600° C. or greater. The optional oxide layer is employed in the present invention to control the beta of the bipolar transistor. This optional embodiment of the present invention will be shown in the remaining drawings with the understanding that the optional oxide layer need not be present.

Without breaking vacuum, emitter 32 which is composed of a stack, i.e., bilayer, of in-situ P-doped a:Si and in-situ P-doped polysilicon is formed on the structure shown in FIG. 1 or FIG. 2. Specifically, the emitter is formed using a rapid thermal chemical vapor deposition process wherein the temperature of emitter deposition is about 600° C. or greater and the deposition time is about 2 minutes or less. More preferably, the emitter is deposited in-situ at a temperature of from about 600° to about 670° C. for a time period of from about 60 to about 120 seconds. The resultant structure formed after emitter deposition is shown, for example, in FIG. 3. Note in this drawing, reference numeral 34 denotes the in-situ P-doped a:Si layer and reference numeral 36 denotes the in-situ P-doped polysilicon. It is noted that the structure shown in FIG. 3 contains a lightly doped emitter region which improves the emitter-base breakdown voltage by reducing the electrical field due to high emitter doping concentration at the emitter-base junction as well as decreasing the base-emitter capacitance which improves high frequency.

In some embodiments of the present invention, an optional annealing process may be employed to recrystallize the a:Si layer of the bilayer emitter prior to the in-situ deposition of the P-doped polysilicon layer. Specifically, the optional annealing of the in-situ P-doped a:Si is carried out at a temperature of about 630° C. or greater for a time period of about 30 minutes or less. More preferably, this optional recrystallizing anneal is performed at a temperature of from about 630° to about 650° C. for a time period of from about 1200 to about 1800 seconds. The optional recrystallization occurs prior to the in-situ deposition of the P-doped polysilicon layer.

Figure 4:
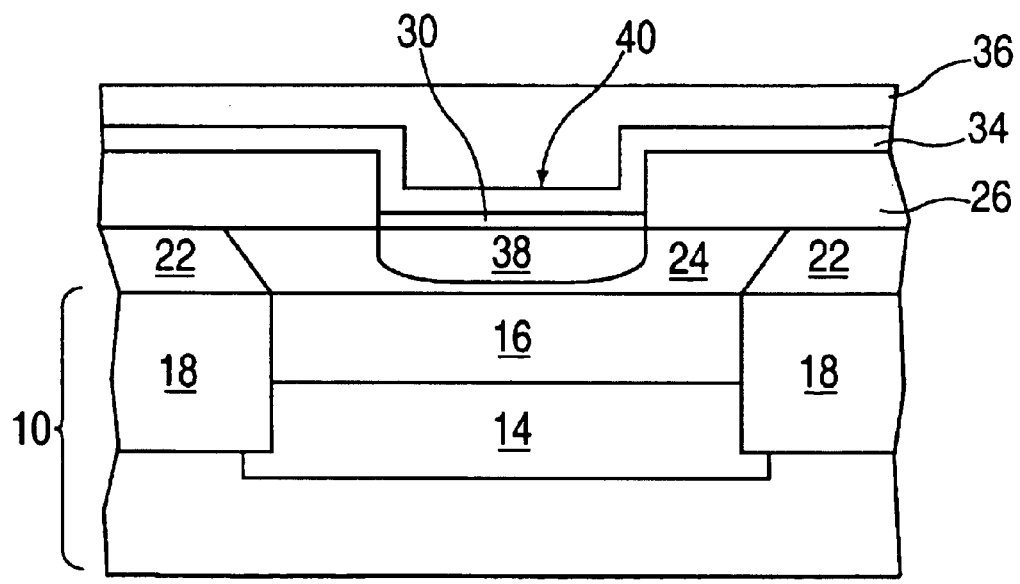

FIG. 4 shows the resultant structure that is formed after the structure is subjected to an activation annealing process which is capable of driving P into the single crystal SiGe base region so as to form emitter outdiffusion region 38 in the single crystal SiGe base region. Specifically, the emitter outdiffusion region is formed by utilizing an activation annealing process which is performed at a temperature of about 950° C. or less, with an activation annealing temperature of from about 900° to about 930° C. being more highly preferred.

Figure 3:
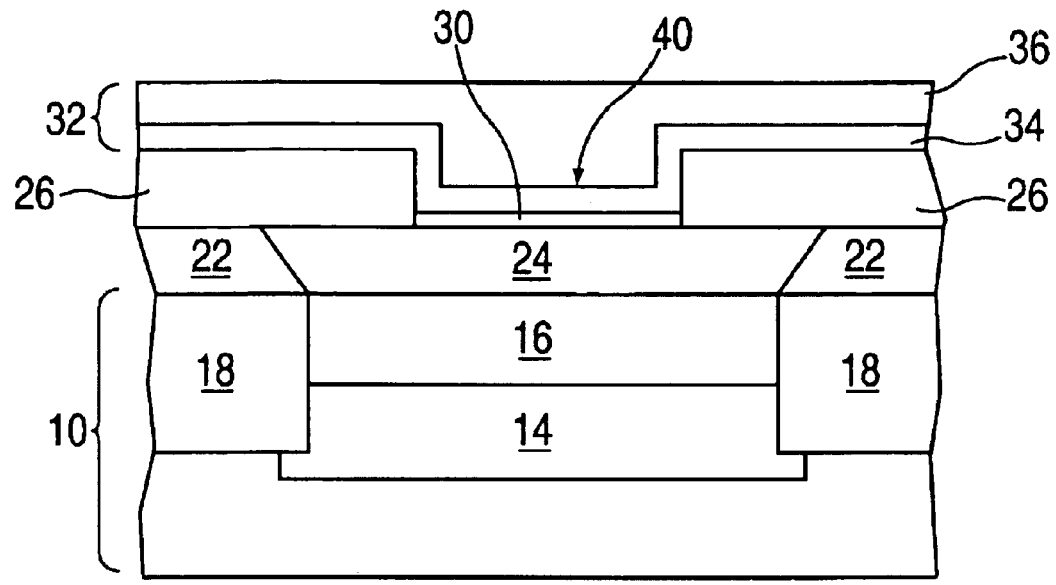

With RTO or without RTO, the inventive process has been found to control the oxygen concentration present at the single crystal emitter and polycrystalline emitter interface (labeled as reference numeral 40 in FIGS. 3 and 4). The control of the oxygen concentration at this interface is important since it also controls the current gain beta which is defined as Ic/Ib. Also, the emitter resistance can be improved by lowering the oxygen concentration at this interface. Furthermore, as the emitter size decreases, typical prior art emitter implantation drive-in tends to be interfered with by the topography of the emitter. By using the inventive in-situ emitter deposition mentioned above, the P dopant is brought right up to the single crystalline and polycrystalline emitter interface. Phosphorus is a faster diffuser, and only a low thermal cycle (on the order of about 950° C. or less) is required to achieve a functioning emitter-base junction. This reduced thermal cycle also minimizes dopant outdiffusion in the collector and base regions which in turn reduces parasitics and minimizes transit time and improves the device performance.

The inventive process wherein an in-situ deposited emitter is formed, can tweak or lower the beta depending on the application of the bipolar device. The lower beta, in turn, increases the breakdown voltage of the device.

The problems solved by the present invention include (1) There is no oxide thickness non-uniformity issues which causes beta variation. With a sandwiched a:Si layer, the deposition conformality is better, and beta control is better.

(2) Without the thin interfacial oxide, the emitter resistance is improved because the emitter is realigned and becomes a partially single crystalline emitter.

(3) With bi-layer or multi-layer of a:Si and doped polysilicon, an a:Si layer is first grown with a lower dopant concentration and then deposited doped polysilicon with a higher concentration. This allows for tailor fabrication of an emitter-to-base dopant profile. Without impacting AC performance fT and fmax much, we can obtain improved breakdown voltages BVceo, BVebo, and reduced emitter-to-base capacitance Ceb.

(4) Since a:Si is very conformal, for small and high-aspect-ratio emitter openings, the bi-layer or multi-layer in-situ phos-doped a:Si and polysilicon layers can improve overall emitter uniformity. The emitter drive-in temperature can be lower than 950° C. which is also advantageous for dopant profile control due to less dopant outdiffusion.

(5) Additional carbon can be added to the bi-layer or multi-layer phos-doped a:Si and poly layer to change the diffusivity of phosphorus by RTCVD. This can be used to tailor the emitter-to-base dopant profile.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope and spirit of the appended claims.

Having thus described our invention in detail, what we claim as new and desire to secure by the letters patent is:

1. A method of fabricating a SiGe heterojunction bipolar transistor comprising forming an emitter layer atop a patterned SiGe base structure, wherein said emitter layer is a bilayer of in-situ P-doped a:Si and in-situ P-doped polysilicon.

2. The method of claim 1 further comprising thermal growing an oxide layer atop a portion of said patterned SiGe base structure prior to forming said emitter layer.

3. The method of claim 2 wherein said oxide layer is formed utilizing a rapid thermal oxidation process which is performed in an oxygen-containing atmosphere at a temperature of about 600° C. or greater.

4. The method of claim 2 wherein said oxide layer is formed atop exposed portions of a single crystal SiGe region present in said SiGe layer.

5. The method of claim 1 wherein said bilayer is formed using a rapid thermal chemical vapor deposition process wherein the temperature of emitter deposition is about 600° C. or greater for a time period of about 2 minutes or less.

6. The method of claim 1 further comprising subjecting said in-situ P-doped a:Si layer to a recrystallizing annealing step prior to forming said in-situ P-doped polysilicon.

7. The method of claim 6 wherein said recrystallizing annealing is carried out at a temperature of about 630° C. or greater for a time period of about 30 minutes or less.

8. The method of claim 1 further comprising subjecting said emitter bilayer to an activation annealing which is capable of driving-P-dopant into a portion of a single crystal SiGe region of the structure.

9. The method of claim 8 wherein said activation annealing is performed at a temperature of about 950° C. or less.

10. The method of claim 1 wherein said SiGe base structure includes at least a SiGe layer present atop a substrate and a patterned insulator present on a portion of said SiGe layer having an opening that exposes a portion of said SiGe layer.

11. The method of claim 10 wherein said SiGe layer includes a single crystal SiGe region present beneath said opening and polycrystalline SiGe regions abutting said single crystal SiGe region.

* * * * *